(12) United States Patent
Peng et al.

(10) Patent No.: US 12,476,399 B2
(45) Date of Patent: Nov. 18, 2025

(54) ARRAY TYPE CONNECTION STRUCTURE AND ELECTRONIC DEVICE

(71) Applicant: HUAWEI TECHNOLOGIES CO., LTD., Guangdong (CN)

(72) Inventors: Zhiyong Peng, Dongguan (CN); Jiayong Chen, Dongguan (CN); Baoliang Sun, Dongguan (CN); Wen Yu, Dongguan (CN); Yinzhong Tang, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 298 days.

(21) Appl. No.: 18/336,059

(22) Filed: Jun. 16, 2023

(65) Prior Publication Data

US 2023/0335932 A1    Oct. 19, 2023

Related U.S. Application Data

(63) Continuation of application No. PCT/CN2021/138448, filed on Dec. 15, 2021.

(30) Foreign Application Priority Data

Dec. 17, 2020 (CN) .......................... 202011492203.9
Jul. 19, 2021 (CN) .......................... 202110814100.8

(51) Int. Cl.
*H01R 12/72* (2011.01)
*H01R 12/67* (2011.01)
*H01R 13/533* (2006.01)

(52) U.S. Cl.
CPC ........... *H01R 12/724* (2013.01); *H01R 12/67* (2013.01); *H01R 13/533* (2013.01)

(58) Field of Classification Search
CPC ..... H01R 12/724; H01R 12/67; H01R 13/533
(Continued)

(56) References Cited

U.S. PATENT DOCUMENTS

| 4,748,495 A * | 5/1988 | Kucharek ........... H01L 23/4338 |
| | | 257/E23.094 |
| 9,039,426 B1 * | 5/2015 | Wu ........................ H01R 12/00 |
| | | 439/66 |

(Continued)

FOREIGN PATENT DOCUMENTS

| CN | 220776314 U | 4/2024 |
| WO | 2003014895 A2 | 2/2003 |

OTHER PUBLICATIONS

Extended European Search Report dated Apr. 15, 2024, issued for European Application No. 21905761.9 (16 pages).

*Primary Examiner* — Phuong K Dinh

(57) ABSTRACT

An array type connection structure includes a support and connecting assemblies. There is no signal cable routing in the support. Each connecting assembly penetrates through the support; a first side of each connecting assembly has a connector interface including a plurality of first signal terminals, and the connector interface is configured to be connected to a first electronic component located on a first side of the support. A second side of each connecting assembly is directly connected to a plurality of cables, the plurality of cables are in a one-to-one correspondence with the plurality of second signal terminals of the connecting assembly, and the cable is configured to be connected to a second electronic component located on a second side of the support. The support is provided with a heat dissipation through hole, which is at least partially located between two adjacent connecting assemblies.

20 Claims, 5 Drawing Sheets

(58) Field of Classification Search
USPC .................................................... 439/78, 79
See application file for complete search history.

(56) References Cited

U.S. PATENT DOCUMENTS

| | | |
|---|---|---|
| 2005/0207134 A1 | 9/2005 | Belady et al. |
| 2014/0071632 A1* | 3/2014 | Sunaga ............... G02B 6/4284 |
| | | 361/728 |
| 2015/0257304 A1 | 9/2015 | Lehman et al. |
| 2015/0289405 A1 | 10/2015 | Stewart et al. |
| 2015/0355690 A1 | 12/2015 | Baba |
| 2019/0067251 A1* | 2/2019 | Bando .................. H01L 23/473 |
| 2019/0373763 A1 | 12/2019 | Simpson |

* cited by examiner

ARRAY TYPE CONNECTION STRUCTURE AND ELECTRONIC DEVICE

CROSS-REFERENCE TO RELATED APPLICATIONS

This application is a continuation of International Application No. PCT/CN2021/138448, filed on Dec. 15, 2021, which claims priority to Chinese Patent Application No. 202110814100.8, filed on Jul. 19, 2021 and Chinese Patent Application No. 202011492203.9, filed on Dec. 17, 2020. All of the aforementioned patent applications are hereby incorporated by reference in their entireties.

TECHNICAL FIELD

This disclosure relates to the field of electronic components, and in particular, to an array type connection structure and an electronic device.

BACKGROUND

In a data center, there are a large number of servers, and the servers are placed in a cabinet. A server mainly includes a frame and a plurality of electronic components. The electronic components are mounted in the frame, and they are electrically connected to each other as required to constitute server.

In related technologies, an electronic component mainly includes a chip set and a plurality of hard disks arranged in an array form. To regularize arrangement of the electronic component, the chip set is not directly electrically connected to each hard disk through cables. Instead, the hard disk is usually arranged on one side of the frame, the chip set is arranged on the other side of the frame, and the chip set and the hard disk are connected via a back plate. The back plate is a printed circuit board (PCB), connectors are respectively disposed on two sides of the back plate, the hard disk is inserted into the connector on one side of the back plate, and the chip set is connected to the connector on the other side of the back plate through the cable.

However, because the back plate is disposed between the chip set and the hard disk, the back plate blocks heat dissipation airflow between the chip set and the hard disk. As a result, a heat dissipation effect is greatly reduced. In addition, because the hard disk and the chip set are connected via the back plate, a large signal loss is caused.

SUMMARY

Embodiments of this disclosure provide an array type connection structure and an electronic device, to overcome a problem that a heat dissipation effect is poor in related technologies.

According to a first aspect, this disclosure provides an array type connection structure, and the array type connection structure includes a support and a plurality of connecting assemblies. There is no signal cable routing in the support, and this is not for signal transmission. The support is configured to fasten the plurality of connecting assemblies, the plurality of connecting assemblies are sequentially arranged at intervals along a length direction of the support, and each of the connecting assemblies penetrates through the support. A first side of each of the connecting assemblies has a connector interface, a plurality of first signal terminals are included inside the connector interface, and the connector interface is configured to be directly inserted to a first electronic component located on a first side of the support, that is, the first electronic component can be directly inserted into the connector interface, to be electrically connected to the plurality of first signal terminals inside the connector interface. A second side of each of the connecting assemblies is directly connected to a plurality of cables, the plurality of cables are electrically connected to a plurality of second signal terminals of the connecting assembly in a one-to-one correspondence, and the cable is configured to be connected to a second electronic component located on a second side of the support. At least a part of the second signal terminals in the plurality of second signal terminals and at least a part of the first signal terminals in the plurality of first signal terminals are electrically connected in a one-to-one correspondence inside the connecting assembly. In other words, the first electronic component and the second electronic component are directly connected through the connecting assembly and the cable. The support is provided with a heat dissipation through hole, and the heat dissipation through hole is at least partially located between two adjacent connecting assemblies. In such an implementation, the heat dissipation through hole can be used as a flow channel of airflow, allowing the airflow to flow between the first side and the second side of the support via the heat dissipation through hole, thereby taking away heat generated when the first electronic component and the second electronic component operate, and further improving a heat dissipation effect of the array type connection structure.

The array type connection structure provided in embodiments of this disclosure has at least the following effects.

After the first electronic component located on the first side of the support and the second electronic component located on the second side of the support are connected together via the connecting assembly and the cables, because no indirect connection is required between the first electronic component and the second electronic component, a signal loss is very small. In the connection process of the first electronic component and the second electronic component, airflow can pass through the support via the heat dissipation through hole, and circulate between the first side and the second side of the support, to take away heat generated when the first electronic component and the second electronic component operate, thereby implementing heat dissipation for the first electronic component and the second electronic component. In other words, the airflow is not blocked by the support, so that heat of the first electronic component and the second electronic component can be fully dissipated.

In an example embodiment, the support includes an outer plate frame and an inner slat. The outer plate frame includes a first side edge, a second side edge, a third side edge, and a fourth side edge that are sequentially connected, the first side edge is opposite to the third side edge, the first side edge and the third side edge extend along a length direction of the outer plate frame, the second side edge is opposite to the fourth side edge, and the connecting assembly is connected to the first side edge, so that the connecting assembly can be connected to the outer plate frame. The inner slat is located between the first side edge and the third side edge, and is away from the first side edge of the outer plate frame, that is, close to the third side edge of the outer plate frame. The inner slat extends along the length direction of the outer plate frame, so that a first end of the inner slat is connected to the second side edge, and a second end of the inner slat is connected to the fourth side edge. The inner slat is connected to the connecting assembly, thereby increasing a connection foundation of the connecting assembly on the support, so that the connecting assembly can be more firmly connected to the support, to ensure reliability of the array type connection structure. The heat dissipation through hole is located in at least one of a region between the inner slat and the first side edge or a region between the inner slat and the third side edge. In such an implementation, at least one side of the inner slat is provided with the heat dissipation through hole, so that a flow-through area of the heat dissipation through hole can be ensured.

In an example embodiment, the heat dissipation through hole includes a first sub through hole and a second sub through hole. The first sub through hole is located between one side edge of the inner slat in a length direction and the first side edge of the outer plate frame, and the second sub through hole is located between the other side edge of the inner slat in the length direction and the third side edge of the outer plate frame. In other words, the first sub through hole and the second sub through hole are respectively located on two opposite sides of the inner slat. In such an implementation, the flow-through area of the support can be ensured, thereby facilitating air flow between the first side and the second side of the support, and further improving heat dissipation performance of the array type connection structure.

In an example embodiment, the first side edge of the outer plate frame is provided with a plurality of first mounting holes, and the first mounting holes are sequentially arranged at intervals along the length direction of the outer plate frame. In such an implementation, mounting the connecting assembly on the first side edge of the outer plate frame can be facilitated through the first mounting hole, so that the connecting assembly is conveniently and firmly connected to the outer plate frame. The inner slat is provided with a plurality of second mounting holes, and the second mounting holes are sequentially arranged at intervals along the length direction of the inner slat. Based on a same principle as the first mounting hole, such an implementation provides facilitation for mounting the connecting assembly on the inner slat using the second mounting hole, so that the connecting assembly is conveniently and firmly connected to the inner slat. In addition, because the connecting assembly is separately connected to the first side edge of the outer plate frame and the inner slat, the connecting assembly can be firmly mounted on the support by using the first side edge of the outer plate frame and the inner slat as mounting foundations.

In an example embodiment, the support further includes a first reinforcing rib and a second reinforcing rib. The first reinforcing rib is connected between one side edge of the inner slat in the length direction and the first side edge. The second reinforcing rib is connected between the other side edge of the inner slat in the length direction and the third side edge. It can be seen that the first reinforcing rib and the second reinforcing rib are respectively located on the two opposite sides of the inner slat. In such an implementation, the opposite sides of the inner slat can be reinforced by the first reinforcing rib and the second reinforcing rib respectively, so that the inner slat is firmly connected in the outer plate frame, thereby improving connection stability of the connecting assembly on the support.

In an example embodiment, the support includes an outer plate frame. The outer plate frame includes a first side edge, a second side edge, a third side edge, and a fourth side edge that are sequentially connected, the first side edge is opposite to the third side edge, the first side edge and the third side edge extend along a length direction of the outer plate frame, the second side edge is opposite to the fourth side edge, and the connecting assembly is connected to the first side edge, so that the connecting assembly can be connected to the outer plate frame. The heat dissipation through hole is located among the first side edge, the second side edge, the third side edge, and the fourth side edge. In such an implementation, the inner slat, the first reinforcing rib, and the second reinforcing rib are omitted, so that the flow-through area of the heat dissipation through hole is further increased, thereby facilitating air flow between the first side and the second side of the support, and further improving the heat dissipation performance of the array type connection structure.

In an example embodiment, the first side edge of the outer plate frame is provided with third mounting holes, and the third mounting holes are sequentially arranged at intervals along the length direction of the outer plate frame. In such an implementation, mounting the connecting assembly on the first side edge of the outer plate frame can be facilitated through the third mounting hole, so that the connecting assembly is conveniently and firmly connected to the outer plate frame. In addition, because the inner slat is omitted, only the third mounting hole needs to be provided on the first side edge of the outer plate frame, which saves materials and facilitates cost control.

In an example embodiment, an orthographic projection of the connecting assembly on the support is at least partially located in the heat dissipation through hole. In other words, the connecting assembly blocks a part of the heat dissipation through hole. In such an implementation, it is ensured that the airflow can also flow through the connecting assembly while flowing through the heat dissipation through hole, allowing the airflow to dissipate heat for the first electronic component and the second electronic component, and also dissipate heat for the connecting assembly. This further improves the heat dissipation performance of the array type connection structure. Alternatively, there is a spacing between the connecting assembly and an edge of the adjacent heat dissipation through hole. In other words, the connecting assembly and the heat dissipation through hole are spaced apart from each other, and the connecting assembly does not block the heat dissipation through hole. In such an implementation, the flow-through area of the heat dissipation through hole can be ensured, thereby ensuring that the airflow can fully dissipate heat for the first electronic component and the second electronic component.

In an example embodiment, the connecting assembly includes a housing and a connector. The housing is located on the second side of the support and is connected to the support, to implement a fixed connection between the connecting assembly and the support. A second part of the connector is inserted into the housing, and the plurality of second signal terminals are located in the second part of the connector, to be electrically connected to the second electronic component through the cable. It can be seen that the connector uses the housing as a mounting foundation. In addition, because the second part of the connector is located on the second side of the support, the connector of this part can be conveniently electrically connected to the second electronic component through the cable. A first part of the connector is located outside the housing and is located on the first side of the support, and the plurality of first signal terminals are located in the first part of the connector, to be electrically connected to the first electronic component through the connector interface. In such an implementation, the first part of the connector can be conveniently connected to the first electronic component. In other words, through the foregoing implementation, the housing is used to provide the mounting foundation for the connector, so that two parts of the connector are respectively located on the first side and the second side of the support, so that the first electronic component and the second electronic component can be separately connected through the connector conveniently.

In an example embodiment, the housing includes a first half housing and a second half housing. The first half housing is connected to the support, to implement a connection between the housing and the support. The second half housing is detachably connected to the first half housing, and there is a gap between the second half housing and the first half housing for accommodating the connector, so that the connector can be firmly mounted through the first half housing and the second half housing.

In an example embodiment, the connector includes a first sub-connector. The first sub-connector includes a first lead part and a first socket part. The first lead part is located in the gap, the plurality of second signal terminals are located in the first lead part, the first socket part protrudes from the gap and is located on the second side of the support, the plurality of first signal terminals are located in the first socket part, and the first socket part is configured to be connected to the first electronic component. The first signal terminal is disposed in the first socket part, and an electrical connection between the first electronic component and the first signal terminal can be implemented by inserting the first electronic component into the first socket part. The second signal terminal is disposed in the first lead part. Because the second signal terminal is separately electrically connected to the first signal terminal and the cable, an electrical connection between the cable and the first electronic component is implemented. After the cable is electrically connected to the second electronic component, an electrical connection between the second electronic component and the first electronic component can be implemented.

In an example embodiment, the first sub-connector further includes a first fastener, the first fastener is located between the first lead part and the first socket part, and the first fastener is separately clamped to the first half housing and the second half housing, thereby implementing a firm connection of the first sub-connector between the first half housing and the second half housing through the first fastener.

In an example embodiment, the first sub-connector further includes a positioning pin, the positioning pin is located in the first socket part, one end of the positioning pin is connected to the first socket part, and the other end of the positioning pin extends away from the first lead part and is inserted into the support. In such an implementation, the first sub-connector and the support can be directly positioned through the positioning pin, thereby ensuring mounting accuracy between the first sub-connector and the support, and facilitating insertion between the electronic component and the first sub-connector.

In an example embodiment, the connector further includes a second sub-connector. The second sub-connector and the first sub-connector are spaced apart from each other, the second sub-connector includes a second lead part and a second socket part, the second lead part is located in the gap and is electrically connected to the first lead part, the second socket part protrudes from the gap and is located on the second side of the support, and the second socket part is configured to be connected to the second electronic component. Because the second lead part is electrically connected to the first lead part, the second lead part can lead a signal of a part of the first signal terminals to the second socket part and transmit the signal to the second electronic component through the second socket part. In this way, manners of connecting the connecting assembly to the first electronic component and the second electronic component are more diversified, which facilitates overall wiring of the array type connection structure.

In an example embodiment, the second side of the connecting assembly further includes a plurality of third signal terminals. The plurality of third signal terminals are located in the first lead part, at least a part of the third signal terminals in the plurality of third signal terminals and at least a part of the first signal terminals in the plurality of first signal terminals are electrically connected in a one-to-one correspondence inside the connecting assembly, and the plurality of third signal terminals are connected to the second lead part. In other words, the first signal terminal can transmit all electrical signals of the first electronic component, the second signal terminal transmits a part of electrical signals of the first electronic component and transmits the part of electrical signals to the second electronic component through the cable, and the third signal terminal transmits another part of electrical signals of the first electronic component and transmits the another part of electrical signals to the second electronic component through the second socket part.

In an example embodiment, the first sub-connector is a high-speed connector, and the second sub-connector is a low-speed connector. In this way, a high-speed signal between the first electronic component and the second electronic component is transmitted through the first sub-connector, and a low-speed signal between the first electronic component and the second electronic component is transmitted through the second sub-connector.

In an example embodiment, the second sub-connector further includes a second fastener, the second fastener is located between the second lead part and the second socket part, and the second fastener is separately clamped to the first half housing and the second half housing, thereby implementing a firm connection of the second sub-connector between the first half housing and the second half housing through the second fastener.

According to a second aspect, this disclosure further provides an electronic device, including a frame, an array type connection structure, a fan set, a first electronic component, and a second electronic component. The array type connection structure is the array type connection structure according to the first aspect, and a support of the array type connection structure is connected to the frame. As the array type connection structure has all advantageous effects of the array type connection structure according to the first aspect, the array type connection structure can implement an electrical connection between the first electronic component and the second electronic component, and also implement ventilation and heat dissipation of the first electronic component and the second electronic component. The fan set is connected to the frame, the fan set is disposed opposite to the array type connection structure, and the fan set is located on a second side of the support. The fan set can generate airflow between a first side of the support and the second side of the support, and the airflow flows from the first side of the support to the second side of the support, to take away heat through the airflow, thereby achieving a heat dissipation effect. The plurality of first electronic components are located on the first side of the support and are electrically connected to a connector interface of a connecting assembly. The plurality of second electronic components are located on the second side of the support and are electrically connected to a cable.

The electronic device provided in embodiments of this disclosure has at least the following effects.

After the first electronic component and the second electronic component are connected together through the array type connection structure, the first electronic component and the second electronic component can operate normally. In this process, the fan set generates airflow, and the airflow can flow between two adjacent connecting assemblies through a heat dissipation through hole, that is, pass through the second side of the support from the first side of the support, to take away heat generated when the first electronic component and the second electronic component operate, thereby implementing heat dissipation for the first electronic component and the second electronic component. In other words, the airflow is not separated by the support, so that the airflow can fully dissipate heat for the first electronic component located on the first side of the support and the second electronic component located on the second side of the support, thereby ensuring a heat dissipation effect of the electronic device.

Figure 1:
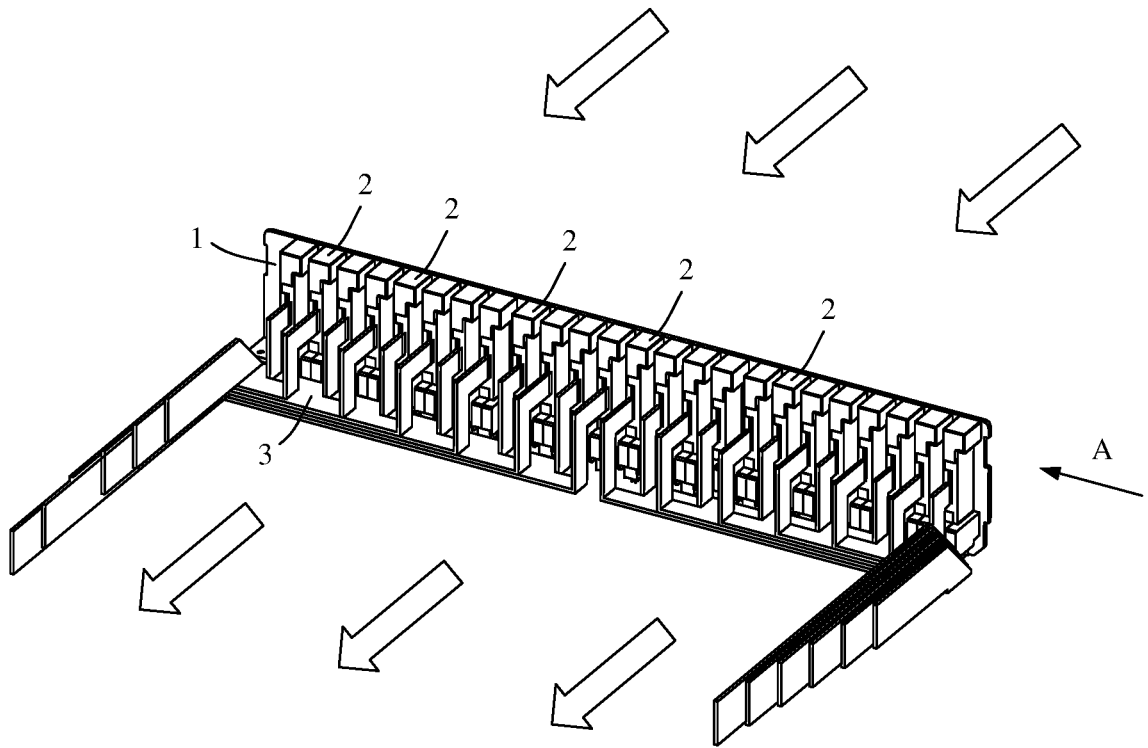
FIG. 1 is a schematic diagram of use of an array type connection structure according to an embodiment of this disclosure.

REFERENCE NUMERALS 1. support; 11. heat dissipation through hole; 111. first sub through hole; 112. second sub through hole; 12. outer plate frame; 121. first side edge; 1211. first mounting hole; 1212. third mounting hole; 1213. light hole; 122. second side edge; 123. third side edge; 124. fourth side edge; 13. inner slat; 131. second mounting hole; 14. first reinforcing rib; 15. second reinforcing rib;
2. connecting assembly; 2a. first signal terminal; 2b. second signal terminal; 2c. third signal terminal; 21. housing; 21a. notch; 211. first half housing; 212. second half housing; 22. connector; 221. first sub-connector; 2211. first lead part; 2212. first socket part; 2213. first fastener; 2214. positioning pin; 222. second sub-connector; 2221. second lead part; 2222. second socket part; 2223. second fastener;
3. cable;
100. frame; 200. array type connection structure; 300. fan set; 500. first electronic component; 600. second electronic component; 610. main board; and 620. socket.

DESCRIPTION OF EMBODIMENTS

To make the objectives, technical solutions, and advantages of this disclosure clearer, the following further describes implementations of this disclosure in detail with reference to the accompanying drawings.

In a data center, there are a large number of servers, and the servers are placed in a cabinet. The server mainly includes a frame and a plurality of electronic components. The frame is configured to provide a mounting foundation for the electronic component. The electronic components are mounted in the frame, and the electronic components are electrically connected to each other based on a requirement, to implement functions of the electronic components, thereby forming a server.

In related technologies, the electronic component mainly includes a chip set and a plurality of hard disks arranged in an array type. To regularize arrangement of the electronic component, the chip set is not directly electrically connected to each hard disk through cables. Instead, generally, a back plate is disposed in the frame. The back plate is a printed circuit board (PCB), and a connector is disposed on each of a first side of the back plate and a second side of the back plate. The chip set is disposed in the frame and is located on the first side of the back plate, and the hard disk is disposed in the frame and is located on the second side of the back plate. The chip set is connected to a connector on the first side of the back plate through cables, and the hard disk is inserted into a connector on the second side of the back plate, so that the chip set and the hard disk are connected via the back plate.

However, because the back plate is disposed between the chip set and the hard disk, the back plate blocks heat dissipation airflow between the chip set and the hard disk. As a result, a heat dissipation effect is greatly reduced.

To resolve this technical problem, an embodiment of this disclosure discloses an array type connection structure. FIG. 1 is a schematic diagram of use of the array type connection structure. With reference to FIG. 1, the array type connection structure includes a support 1 and a plurality of connecting assemblies 2. The support 1 is configured to fasten the plurality of connecting assemblies 2 that are sequentially arranged at intervals along a length direction of the support 1, and there is no signal cable routing in the support 1.

Figure 2:
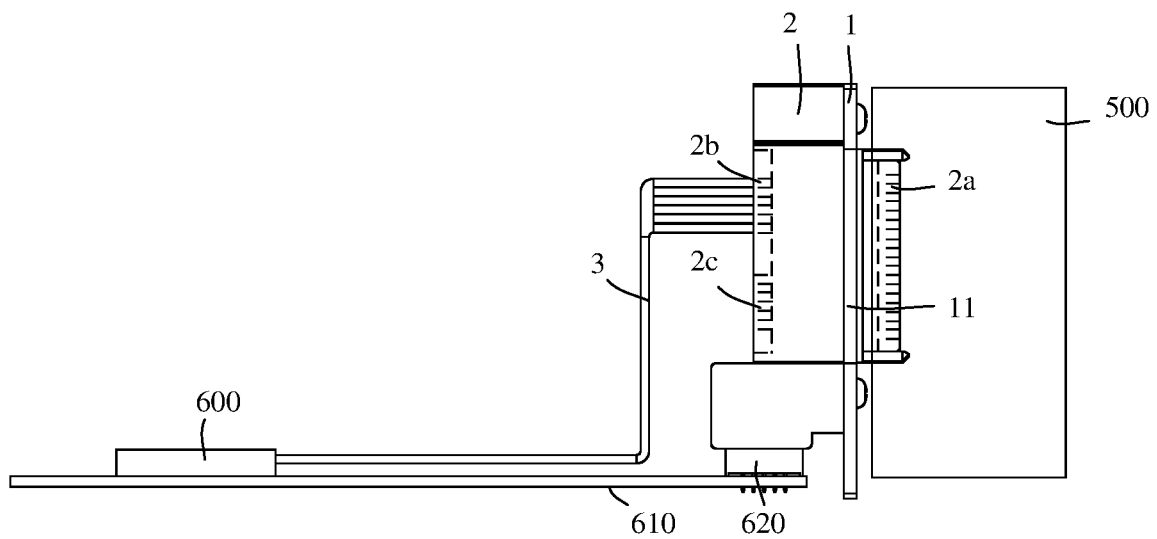
FIG. 2 is an A-direction view of FIG. 1 according to an embodiment of this disclosure.

FIG. 2 is an A-direction view of FIG. 1, in which a left side of the support 1 is a second side of the support 1, and a right side of the support 1 is a first side of the support 1. With reference to FIG. 2, each connecting assembly 2 penetrates through the support 1. A first side of each connecting assembly 2 has a connector interface, the connector interface includes a plurality of first signal terminals 2a, and the connector interface is configured to be connected to a first electronic component 500 located on the first side of the support 1. A second side of each connecting assembly 2 is directly connected to a plurality of cables 3, the plurality of cables 3 are in a one-to-one correspondence with the plurality of second signal terminals 2b of the connecting assembly 2, and the cable 3 is configured to be connected to a second electronic component 600 located on the second side of the support 1. At least a part of the second signal terminals 2b in the plurality of second signal terminals 2b and at least a part of the first signal terminals 2a in the plurality of first signal terminals 2a are electrically connected in a one-to-one correspondence inside the connecting assembly 2. The support 1 is provided with a heat dissipation through hole 11, and the heat dissipation through hole 11 is at least partially located between two adjacent connecting assemblies 2.

The array type connection structure provided in this embodiment of this disclosure has at least the following effects.

After the first electronic component 500 located on the first side of the support 1 and the second electronic component 600 located on the second side of the support 1 are connected together through the connecting assembly 2 and the cable, because no indirect connection is required between the first electronic component 500 and the second electronic component 600, a signal loss is very small. In the connection process of the first electronic component 500 and the second electronic component 600, airflow can pass through the support 1 via the heat dissipation through hole 11, and circulate between the first side and the second side of the support 1, to take away heat generated when the first electronic component 500 and the second electronic component 600 operate, thereby implementing heat dissipation for the first electronic component 500 and the second electronic component 600. In other words, the airflow is not blocked by the support 1, so that heat of the first electronic component 500 and the second electronic component 600 can be fully dissipated.

In the foregoing implementation, because there is no signal cable routing in the support 1, the support 1 only serves to provide a mounting foundation for the connecting assembly 2. For example, the support 1 is a metal profile, and has higher strength than the back plate (printed circuit board) in the related art. In this way, the heat dissipation through hole 11 with a larger flow-through area can be provided on the support 1, to improve heat dissipation performance.

In addition, the second side of the connecting assembly 2 is directly connected to the plurality of cables 3, which means that the cables 3 and the second signal terminal 2b are directly electrically connected, for example, welded together. In other words, there is no another similar component such as an insertion plug between the cable 3 and the second signal terminal 2b. In this way, the signal loss in a transmission process can be reduced as much as possible.

It should be noted that, according to the array type connection structure in this embodiment of this disclosure, the first electronic component 500 and the second electronic component 600 that are located on two sides of the support 1 can be electrically connected, and heat can be dissipated. In this embodiment, the first electronic component 500 is a hard disk, and the second electronic component 600 is a chip set. Certainly, in another embodiment, types of the first electronic component 500 and the second electronic component 600 are not limited to the chip set and the hard disk in the foregoing example, and may further be other electronic components such as a memory and a network interface card. This is not limited in this disclosure.

It can be learned from the foregoing that good heat dissipation of the array type connection structure is implemented using the heat dissipation through hole 11 on the support 1, so the support 1 is a key component. Therefore, the following continues to describe the support 1.

Figure 3:
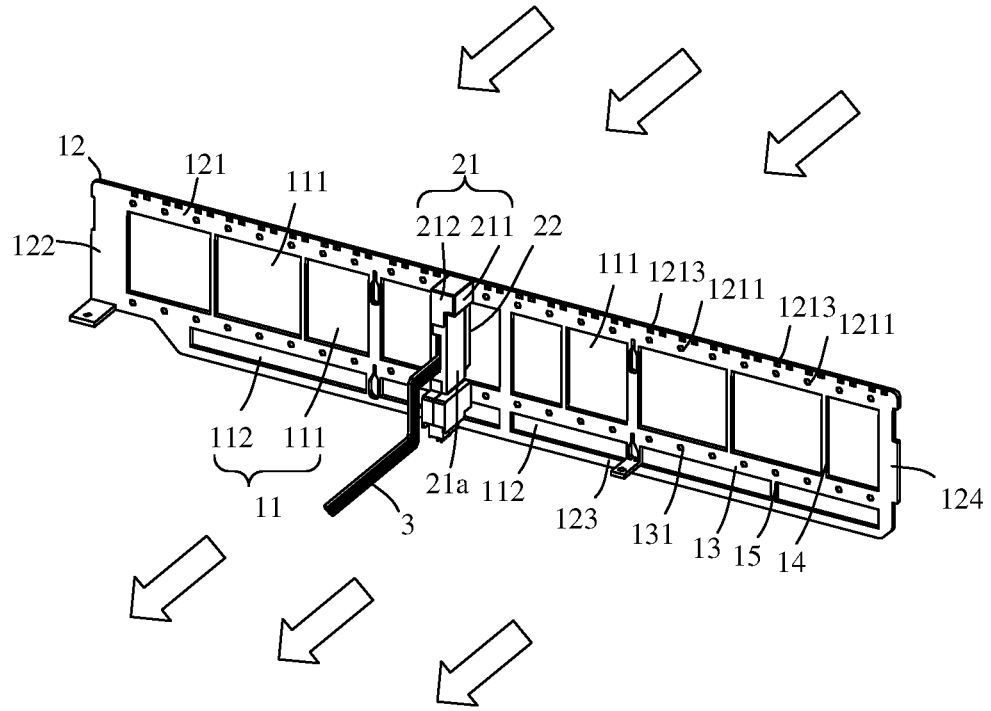
FIG. 3 is a schematic diagram of a structure of an array type connection structure according to an embodiment of this disclosure.

FIG. 3 is a schematic diagram of a structure of an array type connection structure according to an embodiment of this disclosure. Because connection manners between the connecting assemblies 2 and the support 1 are the same, to stand out structures of the connecting assembly 2 and the support 1, the first electronic component 500 and the second electronic component 600 are omitted in FIG. 3, and only one connecting assembly 2 is retained.

Refer to FIG. 3. In this embodiment, the support 1 includes an outer plate frame 12 and an inner slat 13. The outer plate frame 12 includes a first side edge 121, a second side edge 122, a third side edge 123, and a fourth side edge 124 that are sequentially connected, the first side edge 121 is opposite to the third side edge 123, the first side edge and the third side edge extend along a length direction of the outer plate frame 12, the second side edge 122 is opposite to the fourth side edge 124, and the connecting assembly 2 is connected to the first side edge 121. In FIG. 3, the first side edge 121 of the outer plate frame 12 refers to a side edge located at the top, the second side edge 122 of the outer plate frame 12 refers to a side edge located at the left, the third side edge 123 of the outer plate frame 12 refers to a side edge located at the bottom, and the fourth side edge 124 of the outer plate frame 12 refers to a side edge located at the right. The inner slat 13 is located between the first side edge 121 and the third side edge 123 and is away from the first side edge 121 of the outer plate frame 12, the inner slat 13 extends along the length direction of the outer plate frame 12, a first end of the inner slat 13 is connected to the second side edge 122, a second end of the inner slat 13 is connected to the fourth side edge 124, and the connecting assembly 2 is connected to the inner slat 13. In such an implementation, the connecting assembly 2 can be connected to both the first side edge 121 of the outer plate frame 12 and the inner slat 13, thereby increasing a connection foundation of the connecting assembly 2 on the support 1, so that the connecting assembly 2 can be more firmly connected to the support 1, to ensure reliability of the array type connection structure.

The heat dissipation through hole 11 is located in at least one of a region between the inner slat 13 and the first side edge 121 or a region between the inner slat 13 and the third side edge 123. In such an implementation, at least one side of the inner slat 13 is provided with the heat dissipation through hole 11, so that a flow-through area of the heat dissipation through hole 11 can be ensured.

In this embodiment, the heat dissipation through hole 11 includes a first sub through hole 111 and a second sub through hole 112. The first sub through hole 111 is located between one side edge of the inner slat 13 in a length direction and the first side edge 121 of the outer plate frame 12, and the second sub through hole 112 is located between the other side edge of the inner slat 13 in the length direction and the third side edge 123 of the outer plate frame 12. In such an implementation, the first sub through hole 111 and the second sub through hole 112 are respectively located on two opposite sides of the inner slat 13, so that the flow-through area of the support 1 can be ensured, thereby facilitating air flow between the first side and the second side of the support 1, and further improving heat dissipation performance of the array type connection structure.

In the foregoing implementation, the outer plate frame 12 and the inner slat 13 provide a firm mounting foundation for the connecting assembly 2, the heat dissipation through hole 11 is divided into the first sub through hole 111 and the second sub through hole 112, and the two are respectively disposed on two opposite sides of the inner slat 13, so that an area between the outer plate frame 12 and the inner slat 13 can be used as much as possible, to ensure the flow-through area of the heat dissipation through hole 11. It is easy to understand that the inner slat 13 and the outer plate frame 12 are located in a same plane, and when an area of the outer plate frame 12 is fixed, if an area of the inner slat 13 is larger, connection stability of the connecting assembly 2 is better, but an area occupied by the heat dissipation through hole 11 is also larger. In this case, if stability of a connection between the support 1 and the connecting assembly 2 needs to be ensured, the area of the inner slat 13 is correspondingly increased. On the contrary, if the flow-through area of the heat dissipation through hole 11 needs to be ensured, the area of the inner slat 13 is correspondingly reduced. This is not limited in this disclosure.

For example, the first side edge 121 of the outer plate frame 12, the third side edge 123 of the outer plate frame 12, and the inner slat 13 are parallel to each other, that is, all extend along the length direction of the support 1. In such an implementation, the connecting assemblies 2 can be sequentially arranged at intervals along the length direction of the support 1. Certainly, there may also be an angle between the first side edge 121 of the outer plate frame 12, the third side edge 123 of the outer plate frame 12, and the inner slat 13, and the angle can be adjusted based on an actual requirement. This is not limited in this disclosure.

For example, the connecting assembly 2 is a long stripshaped structural member, one end of the connecting assembly 2 in a length direction is connected to the first side edge 121 of the outer plate frame 12, and the other end of the connecting assembly 2 in the length direction is connected to the inner slat 13. In another embodiment, the connecting assembly 2 may also be a square structural member, a circular structural member, or the like. If the connecting assembly 2 is a square structural member, two opposite sides of the connecting assembly 2 are respectively connected to the first side edge 121 of the outer plate frame 12 and the inner slat 13. If the connecting assembly 2 is a circular structural member, two ends of the connecting assembly 2 that are opposite in a radial direction are respectively connected to the first side edge 121 of the outer plate frame 12 and the inner slat 13. This is not limited in this disclosure.

It can be learned from the foregoing that the outer plate frame 12 and the inner slat 13 provide the mounting foundation for the connecting assembly 2. To implement connections of the connecting assembly 2 to the outer plate frame 12 and the inner slat 13, still refer to FIG. 3. In this embodiment, the first side edge 121 of the outer plate frame 12 is provided with a plurality of first mounting holes 1211, and the first mounting holes 1211 are sequentially arranged at intervals along the length direction of the outer plate frame 12. In such an implementation, mounting the connecting assembly 2 on the first side edge 121 of the outer plate frame 12 can be facilitated through the first mounting hole 1211, so that the connecting assembly 2 is conveniently and securely connected to the outer plate frame 12.

The inner slat 13 is provided with a plurality of second mounting holes 131, and the second mounting holes 131 are sequentially arranged at intervals along the length direction of the inner slat 13. Based on a same principle as the first mounting hole 1211, in such an implementation, mounting the connecting assembly 2 on the inner slat 13 can be facilitated through the second mounting hole 131, so that the connecting assembly 2 is conveniently and firmly connected to the inner slat 13.

In the foregoing implementation, because the connecting assembly 2 is separately connected to the first side edge 121 of the outer plate frame 12 and the inner slat 13, the inner slat 13 is away from the first side edge 121 of the outer plate frame 12, the connecting assembly 2 can be firmly mounted on the support 1 by using the first side edge 121 of the outer plate frame 12 and the inner slat 13 as mounting foundations.

For example, the first mounting hole 1211 and the second mounting hole 131 can be configured to accommodate screws. In this case, an outer wall of the connecting assembly 2 is correspondingly provided with two matching screw holes. When the connecting assembly 2 is mounted on the support 1, one screw hole on the connecting assembly 2 is aligned with the first mounting hole 1211 and the other screw hole is aligned with the second mounting hole 131. After alignment, the two screws respectively pass through the first mounting hole 1211 and the second mounting hole 131, so that the two screws are respectively screwed into the corresponding screw holes, thereby implementing a firm connection of the connecting assembly 2 to the support 1 through the screws.

For example, in another embodiment, the first mounting hole 1211 and the second mounting hole 131 can also be configured to accommodate bayonet locks. In this case, the outer wall of the connecting assembly 2 is correspondingly provided with two matching bayonet locks. When the connecting assembly 2 is mounted on the support 1, one bayonet lock on the connecting assembly 2 is inserted into the first mounting hole 1211 and the other bayonet lock is inserted into the second mounting hole 131, thereby implementing the firm connection of the connecting assembly 2 to the support 1 through cooperation of the bayonet locks, the first mounting hole 1211, and the second mounting hole 131.

It should be noted that, in addition to the one-to-one correspondence in the foregoing description, a quantity correspondence among the connecting assembly 2, the first mounting hole 1211, and the second mounting hole 131 may be another correspondence. For example, one connecting assembly 2 corresponds to two first mounting holes 1211 and two second mounting holes 131. This is not limited in this disclosure.

In this embodiment, the first side edge 121 of the outer plate frame 12 is provided with a plurality of light holes 1213, and the light holes 1213 are sequentially arranged at intervals along the length direction of the outer plate frame 12. The array type connection structure further includes an indicator light. The indicator light is clamped in the light hole 1213, and the indicator light is electrically connected to the connecting assembly 2 to display an operational status of the connecting assembly 2.

In another embodiment, a position of the light hole 1213 can be adjusted based on an actual requirement, for example, can be located on the second side edge 122 of the outer plate frame 12. This is not limited in this disclosure.

For example, the indicator light is a light emitting diode.

Because the inner slat 13 is located in the outer plate frame 12, two sides are heat dissipation through holes 11, and only two ends are connected to the outer plate frame 12, there is a hidden danger in connection stability. To resolve this problem, refer to FIG. 3. In this embodiment, the support 1 further includes a first reinforcing rib 14 and a second reinforcing rib 15. The first reinforcing rib 14 is connected between one side edge of the inner slat 13 in the length direction and the first side edge 121, and the second reinforcing rib 15 is connected between the other side edge of the inner slat 13 in the length direction and the third side edge 123.

The first reinforcing rib 14 and the second reinforcing rib 15 are respectively located on two opposite sides of the inner slat 13. The two opposite sides of the inner slat 13 can be reinforced by the first reinforcing rib 14 and the second reinforcing rib 15 respectively, so that the inner slat 13 is firmly connected to the outer plate frame 12, thereby improving connection stability of the connecting assembly 2 on the support 1.

For example, the first reinforcing rib 14 and the second reinforcing rib 15 are perpendicular to the inner slat 13, to facilitate arrangement of the connecting assembly 2 and avoid mutual interference among the first reinforcing rib 14, the second reinforcing rib 15, and the connecting assembly 2. It is easy to understand that if the first side edge 121 of the outer plate frame 12, the third side edge 123 of the outer plate frame 12, and the inner slat 13 are parallel to each other, the first reinforcing rib 14 and the second reinforcing rib 15 are perpendicular to the first side edge 121 of the outer plate frame 12, the third side edge 123 of the outer plate frame 12, and the inner slat 13 respectively.

For example, the outer plate frame 12, the inner slat 13, and the first reinforcing rib 14 and the second reinforcing rib 15 are an integral structural member, which can be manufactured through stamping formation processing based on a metal plate. In this way, manufacturing efficiency of the support 1 can be improved and manufacturing costs of the support 1 can be reduced, and structural integrity of the support 1 can be ensured, to improve architectural strength.

Figure 4:
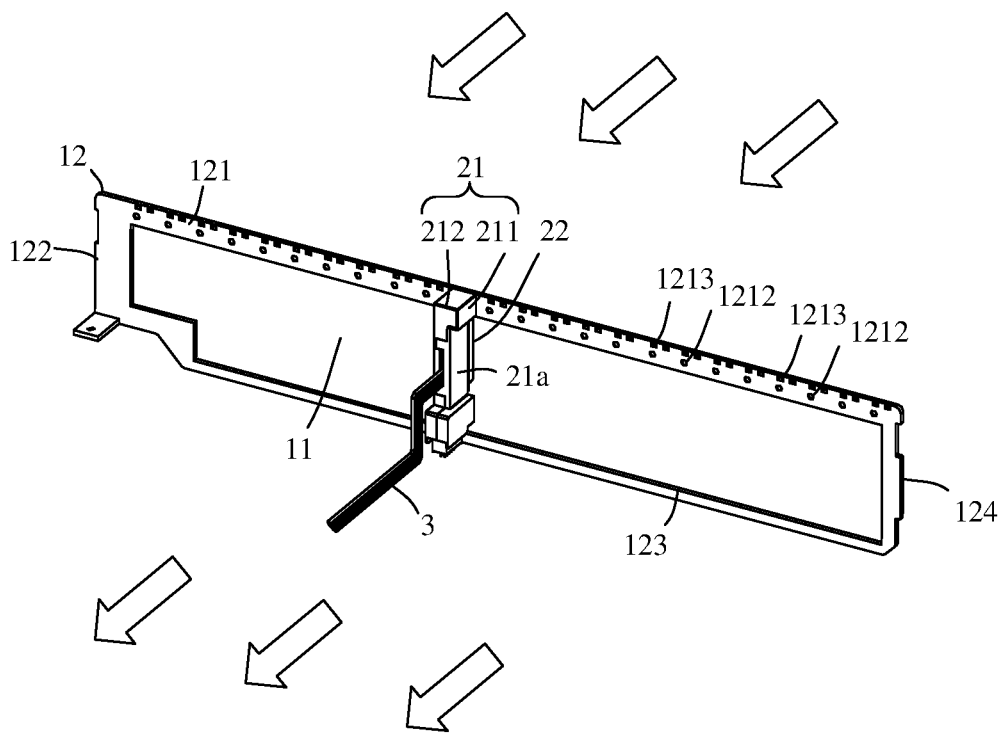
FIG. 4 is a schematic diagram of a structure of another array type connection structure according to an embodiment of this disclosure.

FIG. 4 is a schematic diagram of a structure of another array type connection structure according to an embodiment of this disclosure. A connecting assembly 2 of the array type connection structure is the same as the connecting assembly 2 of the array type connection structure shown in FIG. 3, and a difference mainly lies in the support 1. Based on a same reason as FIG. 3, the first electronic component 500 and the second electronic component 600 are omitted in FIG. 4, and only one connecting assembly 2 is retained.

Refer to FIG. 4. In this embodiment, the support 1 includes an outer plate frame 12, the outer plate frame 12 includes a first side edge 121, a second side edge 122, a third side edge 123, and a fourth side edge 124 that are sequentially connected, the first side edge 121 is opposite to the third side edge 123, the first side edge 121 and the third side edge 123 extend along a length direction of the outer plate frame 12, and the second side edge 122 is opposite to the fourth side edge 124. In FIG. 4, the first side edge 121 of the outer plate frame 12 refers to a side edge located at the top, the second side edge 122 of the outer plate frame 12 refers to a side edge located at the left, the third side edge 123 of the outer plate frame 12 refers to a side edge located at the bottom, and the fourth side edge 124 of the outer plate frame 12 refers to a side edge located at the right. The connecting assembly 2 is connected to the first side edge 121. The heat dissipation through hole 11 is located among the first side edge 121, the second side edge 122, the third side edge 123, and the fourth side edge 124. The heat dissipation through hole 11 is of a long strip shape, and a length direction of the heat dissipation through hole 11 is the same as the length direction of the outer plate frame 12. In such an implementation, the inner slat 13, the first reinforcing rib 14, and the second reinforcing rib 15 are omitted, so that a flow-through area of the heat dissipation through hole 11 is further increased, thereby facilitating air flow between the first side and the second side of the support 1, and further improving heat dissipation performance of the array type connection structure.

In the foregoing implementation, the heat dissipation through hole 11 is designed as an entire through hole, and the heat dissipation through hole 11 is fully arranged in the outer plate frame 12 and is not blocked by another component except the connecting assembly 2, thereby ensuring a maximum design of the flow-through area of the heat dissipation through hole 11.

For example, the first side edge 121 and the third side edge 123 of the outer plate frame 12 are parallel to each other, that is, both extend along the length direction of the support 1. In such an implementation, the connecting assemblies 2 can be sequentially arranged at intervals along the length direction of the support 1. Certainly, there may also be an angle between the first side edge 121 and the third side edge 123 of the outer plate frame 12, and the angle can be adjusted based on an actual requirement. This is not limited in this disclosure.

It can be learned from the foregoing that the outer plate frame 12 provides a mounting foundation for the connecting assembly 2. To implement a connection of the connecting assembly 2 to the outer plate frame 12, still refer to FIG. 4. In this embodiment, the first side edge 121 of the outer plate frame 12 is provided with third mounting holes 1212, and the third mounting holes 1212 are sequentially arranged at intervals along the length direction of the outer plate frame 12. In such an implementation, mounting the connecting assembly 2 on the first side edge 121 of the outer plate frame 12 can be facilitated through the third mounting hole 1212, so that the connecting assembly 2 is conveniently and firmly connected to the outer plate frame 12. In addition, because the inner slat 13 is omitted, only the third mounting hole 1212 needs to be provided on the first side edge 121 of the outer plate frame 12, which saves materials and facilitates cost control.

In the foregoing implementation, a manner of mounting the connecting assembly 2 through the third mounting hole 1212 is the same as that of mounting the connecting assembly 2 through the first mounting hole 1211 and the second mounting hole 131 in the foregoing description, and details are not described herein again.

It should be noted that, because only the first side edge 121 of the outer plate frame 12 is connected to the connecting assembly 2, a width of the first side edge 121 of the outer plate frame 12 is properly increased, which can be more conducive to firm mounting of the connecting assembly 2 on the support 1.

In addition, in addition to the one-to-one correspondence in the foregoing description, a quantity correspondence between the connecting assembly 2 and the third mounting hole 1212 may be another correspondence. For example, one connecting assembly 2 corresponds to two third mounting holes 1212. This is not limited in this disclosure.

For example, to facilitate mounting of the connecting assembly 2 on the support 1, the first mounting hole 1211, the second mounting hole 131, and the third mounting hole 1212 are long strip-shaped oblong holes, so that in a process of mounting the connecting assembly 2 on the support 1, there is room for adaptive adjustment. It is easy to understand that if the support 1 or the connecting assembly 2 has a dimensional deviation, a relative position of the connecting assembly 2 on the support 1 can be finely adjusted through the long strip-shaped oblong hole.

It can be learned from the foregoing that this embodiment of this disclosure provides two types of supports 1. The support 1 shown in FIG. 3 has stronger structural strength, which can support the connecting assembly 2 more firmly. The support 1 shown in FIG. 4 is provided with a larger heat dissipation through hole 11 and a larger flow-through area of the heat dissipation through hole 11, which can have a better heat dissipation effect. In other words, both the two types of supports 1 can enable the array type connection structure to have a heat dissipation function, the connecting assembly 2 can be more firmly mounted on the support 1 shown in FIG. 3, and the support 1 shown in FIG. 4 can better circulate airflow.

In this embodiment, an orthographic projection of the connecting assembly 2 on the support 1 is at least partially located in the heat dissipation through hole 11. In such an implementation, it is ensured that the airflow can also flow through the connecting assembly 2 while flowing through the heat dissipation through hole 11, allowing the airflow to dissipate heat for the first electronic component 500 and the second electronic component 600, and also dissipate heat for the connecting assembly 2. This further improves the heat dissipation performance of the array type connection structure.

In another embodiment, there is a spacing between the connecting assembly 2 and an edge of an adjacent heat dissipation through hole 11. In other words, the connecting assembly 2 and the heat dissipation through hole 11 are spaced apart from each other, and the connecting assembly 2 does not block the heat dissipation through hole 11. In such an implementation, the flow-through area of the heat dissipation through hole 11 can be ensured, thereby ensuring that the airflow can fully dissipate heat for the first electronic component 500 and the second electronic component 600.

The support 1 is mainly described above, and the connecting assembly 2 is described below.

Still refer to FIG. 4. In this embodiment, the connecting assembly 2 includes a housing 21 and a connector 22. The housing 21 is located on the second side of the support 1 and is connected to the support 1, to implement a fixed connection between the connecting assembly 2 and the support 1.

A second part of the connector 22 is inserted into the housing 21, and the plurality of second signal terminals 2b are located in the second part of the connector 22, to be electrically connected to the second electronic component 600 through the cable 3. It can be seen that the connector 22 uses the housing 21 as a mounting foundation. In addition, because the second part of the connector 22 is located on the second side of the support 1, the connector 22 of this part can be conveniently electrically connected to the second electronic component 600 through the cable 3. A first part of the connector 22 is located outside the housing 21 and is located on the first side of the support 1, and the plurality of first signal terminals 2a are located in the first part of the connector 22, to be electrically connected to the first electronic component 500 through an interface of the connector 22. In such an implementation, the first part of the connector 22 can be conveniently connected to the first electronic component 500.

In the foregoing implementation, the housing 21 is used to provide the mounting foundation for the connector 22, so that two parts of the connector 22 are respectively located on the first side and the second side of the support 1, so that the first electronic component 500 and the second electronic component 600 can be separately connected through the connector 22 conveniently.

For example, when the first electronic component 500 is a hard disk, the connector 22 is an SFF-8639 hard disk connector. When the first electronic component 500 is another electronic component, a type of the connector 22 changes accordingly. For example, when the first electronic component 500 is a memory, the connector 22 is a connector 22 adaptive to memory insertion.

For example, the housing 21 is a long strip-shaped structural member, and the housing 21 extends along a direction perpendicular to the length direction of the support 1. When the support 1 includes the inner slat 13, one end of the housing 21 is connected to the first side edge 121 of the outer plate frame 12, and the other end of the housing 21 is connected to the inner slat 13. When the support 1 does not include the inner slat 13, one end of the housing 21 is connected to the first side edge 121 of the outer plate frame 12, and the other end of the housing 21 is suspended or is connected to the third side edge 123 of the outer plate frame 12. In addition, a component such as the screw hole or the bayonet lock for cooperating with the first mounting hole 1211, the second mounting hole 131, and the third mounting hole 1212 is disposed on the housing 21.

Optionally, there is a notch 21a on an outer wall of the housing 21, and a concave direction of the notch 21a is the same as an arrangement direction of the connecting assemblies 2. In such an implementation, blocking on the heat dissipation through hole 11 by the housing 21 can be reduced, so that the flow-through area of the heat dissipation through hole 11 is ensured, thereby improving the heat dissipation effect of the array type connection structure.

Certainly, providing the notch 21a on the housing 21 occupies a mounting space of the connector 22 in the housing 21. Therefore, in another embodiment, if a large mounting space needs to be provided for the connector 22, the notch 21a may not be provided. This is not limited in this disclosure.

In addition, a shape of the notch 21a can be adjusted based on an actual requirement, for example, a square shape or an oval shape. This is not limited in this disclosure.

Figure 5:
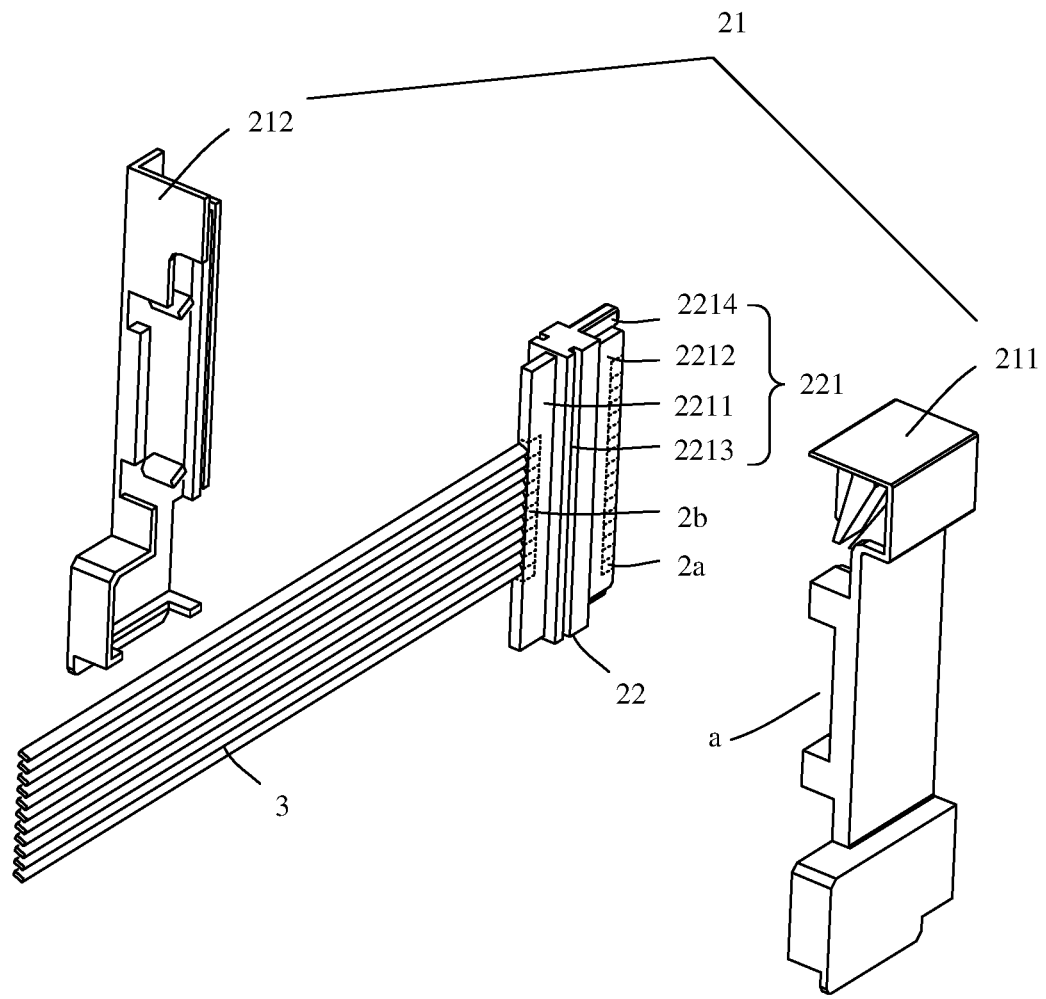
FIG. 5 is an exploded view of a connecting assembly according to an embodiment of this disclosure.
Figure 6:
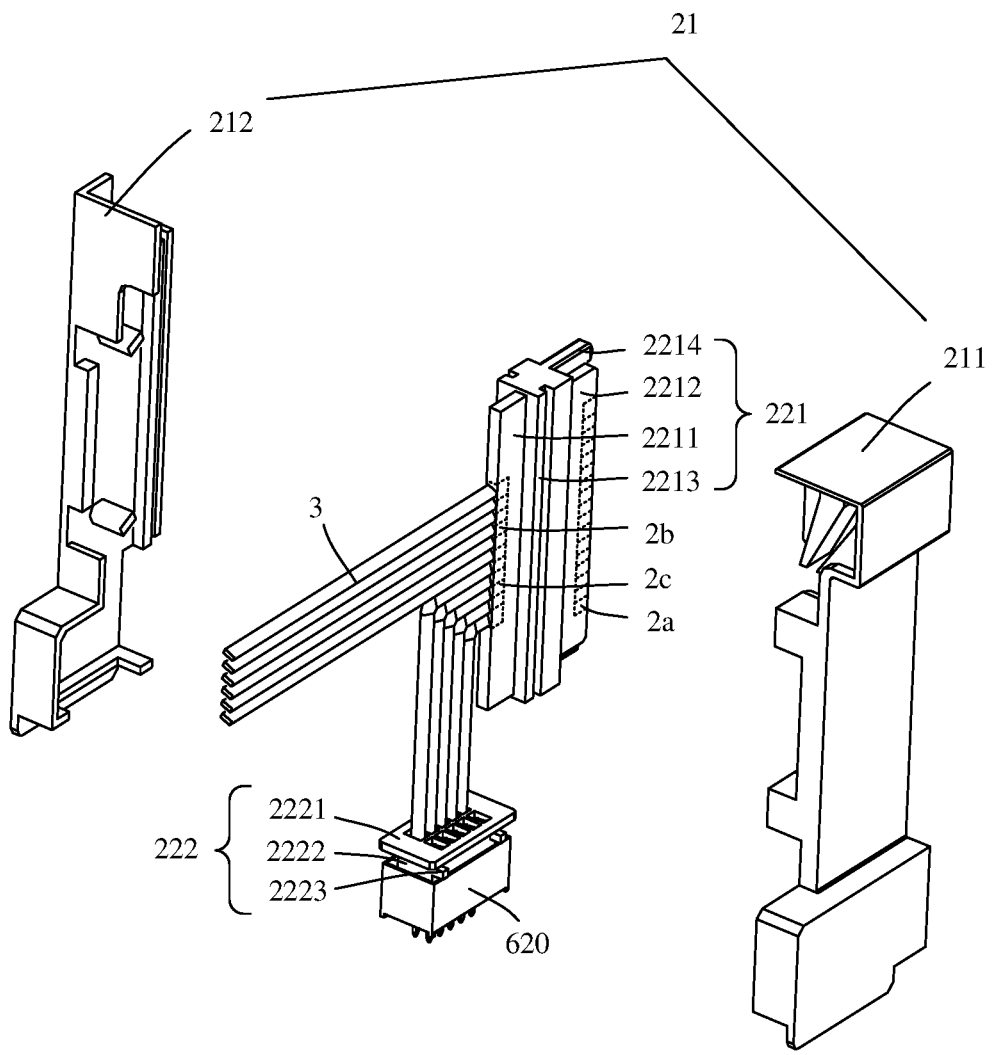
FIG. 6 is an exploded view of a connecting assembly according to an embodiment of this disclosure.
Figure 7:
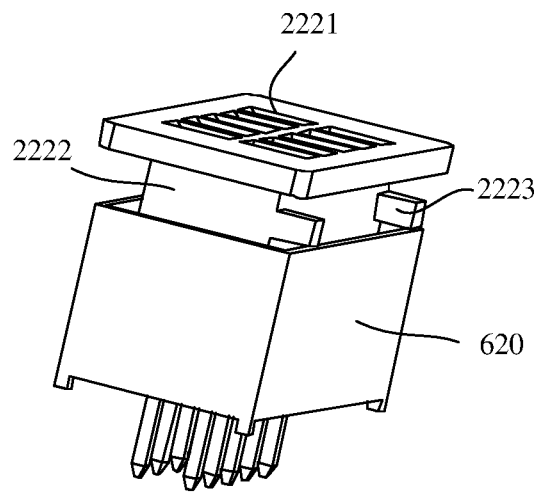
FIG. 7 is a schematic diagram of a structure of a second sub-connector according to an embodiment of this disclosure.

FIG. 5 is an exploded view of the connecting assembly 2. With reference to FIG. 5, in this embodiment, the housing 21 includes a first half housing 211 and a second half housing 212. The first half housing 211 is connected to the support 1, to implement a connection between the housing 21 and the support 1. The second half housing 212 is detachably connected to the first half housing 211, and there is a gap a between the second half housing 212 and the first half housing 211 for accommodating the connector 22, so that the connector 22 can be firmly mounted through the first half housing 211 and the second half housing 212.

In the foregoing implementation, the first half housing 211 and the second half housing 212 are mutually detachable structures. During assembly, the connector 22 is placed between the first half housing 211 and the second half housing 212, and the first half housing 211 and the second half housing 212 are connected together to form the gap a that is capable of accommodating the connector 22, so that the connector 22 can be firmly clamped between the first half housing 211 and the second half housing 212. Then, the first half housing 211 is connected to the support 1, to implement integral mounting of the connecting assembly 2.

For example, both the first half housing 211 and the second half housing 212 are also long strip-shaped structural members, and the first half housing 211 and the second half housing 212 are arranged side by side. One end of the first half housing 211 is connected to one end of the second half housing 212 through a screw, and the other end of the first half housing 211 is connected to the other end of the second half housing 212 through a screw, to implement a detachable connection between the first half housing 211 and the second half housing 212.

In another embodiment, for example, the housing 21 is an integrated structural member. In this case, a jack is disposed on the housing 21, and the connector 22 is inserted into the jack. In such an implementation, the housing 21 can have higher structural strength, to improve reliability of the connecting assembly 2.

Still refer to FIG. 5. In this embodiment, the connector 22 includes a first sub-connector 221.

The first sub-connector 221 includes a first lead part 2211 and a first socket part 2212. The first lead part 2211 is located in the gap a, the plurality of second signal terminals 2b are located in the first lead part 2211, the first socket part 2212 protrudes from the gap a and is located on the second side of the support 1, the plurality of first signal terminals 2a are located in the first socket part 2212, and the first socket part 2212 is configured to be connected to the first electronic component 500.

In such an implementation, the first signal terminal 2a is disposed in the first socket part 2212, and an electrical connection between the first electronic component 500 and the first signal terminal 2a can be implemented by inserting the first electronic component 500 into the first socket part 2212. The second signal terminal 2b is disposed in the first lead part 2211. Because the second signal terminal 2b is separately electrically connected to the first signal terminal 2a and the cable 3, an electrical connection between the cable 3 and the first electronic component 500 is implemented. After the cable 3 is electrically connected to the second electronic component 600, an electrical connection between the second electronic component 600 and the first electronic component 500 can be implemented.

Still refer to FIG. 5. In this embodiment, the first sub-connector 221 further includes a first fastener 2213, the first fastener 2213 is located between the first lead part 2211 and the first socket part 2212, and the first fastener 2213 is separately clamped to the first half housing 211 and the second half housing 212, thereby implementing a firm connection of the first sub-connector 221 between the first half housing 211 and the second half housing 212 through the first fastener 2213.

For example, the first fastener 2213 includes two groups of convex edges. The two groups of convex edges are respectively located on a side of the first sub-connector 221 facing the first half housing 211 and a side of the first sub-connector 221 facing the second half housing 212. One group of convex edges includes two mutually parallel convex edges. Two mutually parallel convex edges are accordingly disposed on both the first half housing 211 and the second half housing 212, and the corresponding four convex edges are staggered and clamped together, to implement positioning of the first sub-connector 221 between the first half housing 211 and the second half housing 212.

In the foregoing implementation, positioning between the first sub-connector 221 and the housing 21 is implemented through the first fastener 2213. In addition, because the housing 21 and the support 1 are positioned and mounted, positioning and mounting between the first sub-connector 221 and the support 1 can be implemented, thereby facilitating insertion between the first electronic component 500 and the first sub-connector 221.

However, because positioning and mounting between the connector 22 and the support 1 is indirectly implemented through the housing 21, both a mounting common difference between the connector 22 and the housing 21 and a mounting common difference between the housing 21 and the support 1 affect positioning accuracy between the connector 22 and the support 1. To resolve this technical problem, for example, the first sub-connector 221 further includes a positioning pin 2214, the positioning pin 2214 is located in the first socket part 2212, one end of the positioning pin 2214 is connected to the first socket part 2212, and the other end of the positioning pin 2214 extends away from the first lead part 2211 and is inserted into the support 1. In such an implementation, the first sub-connector 221 and the support 1 can be directly positioned through the positioning pin 2214, thereby ensuring mounting accuracy between the first sub-connector 221 and the support 1, and facilitating insertion between the first electronic component 500 and the first sub-connector 221.

For example, the positioning pin 2214 is located at the top or bottom of the first socket part 2212. If the first socket part 2212 has two positioning pins 2214, the two positioning pins 2214 are respectively located at the top and the bottom of the first socket part 2212. In such an implementation, positioning and mounting between the first sub-connector 221 and the support 1 can be implemented more stably.

Certainly, to match the positioning pin 2214, the support 1 is provided with a matching positioning hole, and the positioning hole is in a one-to-one correspondence with the positioning pin 2214.

In this embodiment, the connector 22 further includes a second sub-connector 222.

The second sub-connector 222 and the first sub-connector 221 are spaced apart from each other, the second sub-connector 222 includes a second lead part 2221 and a second socket part 2222, the second lead part 2221 is located in the gap a and is electrically connected to the first lead part 2211, the second socket part 2222 protrudes from the gap a and is located on the second side of the support 1, and the second socket part 2222 is configured to be connected to the second electronic component 600.

Because the second lead part 2221 is electrically connected to the first lead part 2211, the second lead part 2221 can lead a signal of a part of the first signal terminals 2a to the second socket part 2222 and transmit the signal to the second electronic component 600 through the second socket part 2222. In this way, manners of connecting the connecting assembly 2 to the first electronic component 500 and the second electronic component 600 are more diversified, which facilitates overall wiring of the array type connection structure.

In this embodiment, the second side of the connecting assembly 2 further includes a plurality of third signal terminals 2c. The plurality of third signal terminals 2c are located in the first lead part 2211, at least a part of the third signal terminals 2c in the plurality of the third signal terminals 2c and at least a part of the first signal terminals 2a of the plurality of first signal terminals 2a are electrically connected in a one-to-one correspondence inside the connecting assembly 2, and the plurality of third signal terminals 2c are connected to the second lead part 2221.

In other words, the first signal terminal 2a can transmit all electrical signals of the first electronic component 500, the second signal terminal 2b transmits a part of electrical signals of the first electronic component 500 and transmits the part of electrical signals to the second electronic component 600 through the cable 3, and the third signal terminal 2c transmits another part of electrical signals of the first electronic component 500 and transmits the another part of electrical signals to the second electronic component 600 through the second socket part 2222.

For example, the first sub-connector 221 is a high-speed connector, the first lead part 2211 and the first socket part 2212 are integrated structural members, and the first lead part 2211 is interconnected with and the first socket part 2212. The second sub-connector 222 is a low-speed connector, and the second lead part 2221 is interconnected with the second socket part 2222. The first socket part 2212 is inserted into the first electronic component 500 (a hard disk), and is configured to transmit a data signal from the first electronic component 500. The second socket part 2222 is inserted into the second electronic component 600 (a chip set), and is configured to transmit a current and a control signal from the second electronic component 600. For example, a current of a power supply, to supply power to the hard disk and the indicator light, and a control signal of the chip set, to control the hard disk and the indicator light. Interconnection between the first socket part 2212 and the second socket part 2222 is implemented through leads between the first lead part 2211 and the second lead part 2221.

Optionally, the second electronic component 600 is connected to a main board 610, the main board 610 is a printed circuit board (PCB), the main board 610 has a socket 620, and the socket 620 is welded on the main board 610 and is electrically connected to the second electronic component 600 through a wiring inside the main board 610. For example, the socket 620 is a female connector, the second socket part 2222 is a male connector, and the second socket part 2222 is inserted together with the socket 620, thereby implementing an electrical connection between the second socket part 2222 and the second electronic component 600.

In this embodiment, the second sub-connector 222 further includes a second fastener 2223. The second fastener 2223 is located between the second lead part 2221 and the second socket part 2222, and the second fastener 2223 is separately clamped to the first half housing 211 and the second half housing 212, thereby implementing a firm connection of the second sub-connector 222 between the first half housing 211 and the second half housing 212 through the second fastener 2223.

For example, the second fastener 2223 includes an outer flange, and the outer flange is perpendicular to a protruding direction of the second socket part 2222. Inner flanges are accordingly disposed on both the first half housing and the second half housing, and a top surface of the inner flange is configured to abut against a bottom surface of the outer flange, to implement positioning of the second sub-connector 222 between the first half housing 211 and the second half housing 212.

Figure 8:
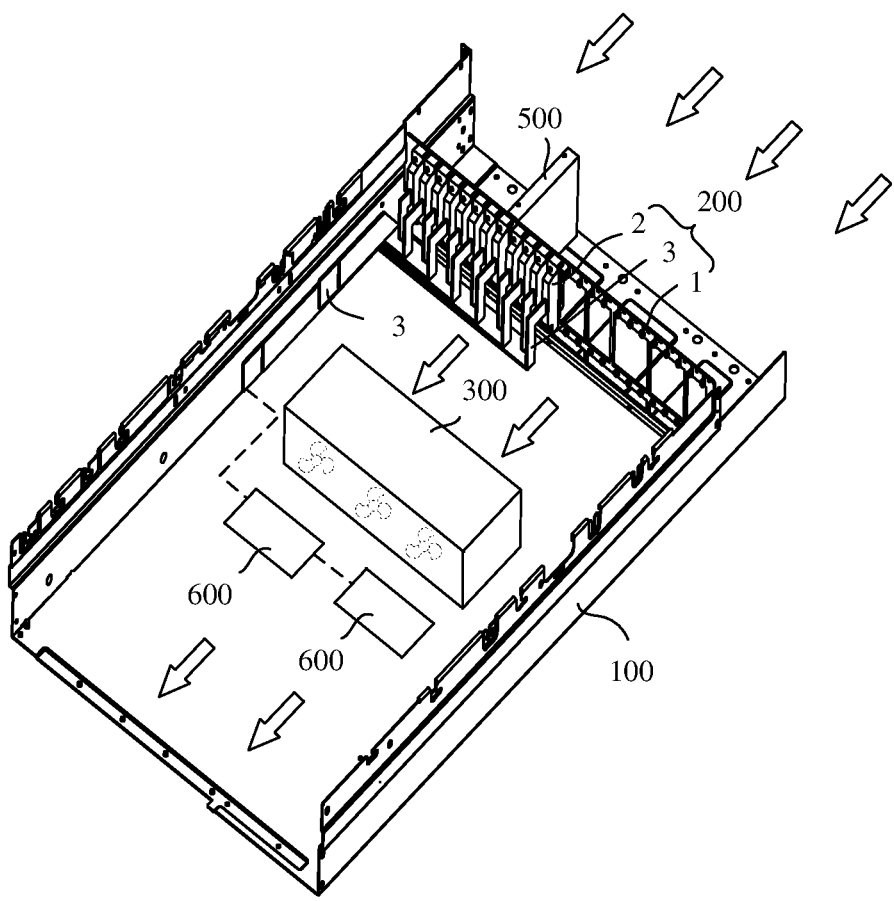
FIG. 8 is an electronic device according to an embodiment of this disclosure.

FIG. 8 is an electronic device according to an embodiment of this disclosure. With reference to FIG. 8, the electronic device includes a frame 100, an array type connection structure 200, a fan set 300, a first electronic component 500, and a second electronic component 600.

The array type connection structure 200 is the array type connection structure shown in FIG. 1 to FIG. 7, and a support 1 of the array type connection structure 200 is connected to the frame 100. The array type connection structure 200 has all advantageous effects of the array type connection structure shown in FIG. 1 to FIG. 7. The array type connection structure 200 can implement an electrical connection between the first electronic component 500 and the second electronic component 600, and improve ventilation and heat dissipation effects of the first electronic component 500 and the second electronic component 600.

The fan set 300 is connected to the frame 100, the fan set 300 is disposed opposite to the array type connection structure 200, and the fan set 300 is located on a second side of the support 1. The fan set 300 can generate airflow between a first side of the support 1 and the second side of the support 1, and the airflow flows from the first side of the support 1 to the second side of the support 1, to take away heat through the airflow, thereby achieving a heat dissipation effect.

The first electronic component 500 is located on the first side of the support 1 and is directly electrically connected to a connector interface. The second electronic component 600 is located on the second side of the support 1 and is electrically connected to a connecting assembly 2 through a cable 3. In such an implementation, the airflow generated by the fan set 300 can take away heat generated by the first electronic component 500 and the second electronic component 600, to implement heat dissipation for the first electronic component 500 and the second electronic component 600.

The electronic device provided in this embodiment of this disclosure has at least the following effects.

After the first electronic component 500 and the second electronic component 600 are connected together through the array type connection structure 200, the first electronic component 500 and the second electronic component 600 can operate normally. In this process, the fan set 300 generates airflow, and the airflow can flow between two adjacent connecting assemblies 2 through a heat dissipation through hole 11, that is, pass through the second side of the support 1 from the first side of the support 1, to take away heat generated when the first electronic component 500 and the second electronic component 600 operate, thereby implementing heat dissipation for the first electronic component 500 and the second electronic component 600. In other words, the airflow is not separated by the support 1, so that the airflow can fully dissipate heat for the first electronic component 500 located on the first side of the support 1 and the second electronic component 600 located on the second side of the support 1, thereby ensuring a heat dissipation effect of the electronic device.

Because the cable 3 is located on the second side of the support 1, the cable 3 may block the airflow. To resolve this problem, in this embodiment, after being connected to the connecting assembly 2, the cable 3 is bent to a lower part of the support 1. Then, along a length direction of the support 1, one part extends to one end of the support 1, and the other part extends to the other end of the support 1. After extending to an inner side wall of the frame 100, the cable 3 is bent again and extends along the inner side wall of the frame 100 away from the support 1, to be connected to the required second electronic component 600. In such an implementation, the heat dissipation through hole 11 on the support 1 can be avoided, thereby avoiding blocking the airflow caused by the cable 3.

In another embodiment, after being connected to the connecting assembly 2, the cable 3 is bent to an upper part of the support 1. Then, along a length direction of the support 1, one part extends to one end of the support 1, and the other part extends to the other end of the support 1. After extending to the inner side wall of the frame 100, the cable 3 is bent again and extends downward along the inner side wall of the frame 100, and then extends along the inner side wall of the frame 100 away from the support 1 after extending to the bottom of the frame 100, to be connected to the required second electronic component 600. In such an implementation, the heat dissipation through hole 11 on the support 1 can also be avoided, thereby avoiding blocking the airflow caused by the cable 3.

For example, the cable 3 is a flat cable, to facilitate bending of the cable 3 for a better cable layout. A rate is selected based on an actual requirement, for example, 25 Gbps, 32 Gbps, or 56 Gbps. This is not limited in this disclosure.

In this embodiment, the second electronic component 600 located on the second side of the support 1 is a chip set, for example, a load-balanced switch (LSW) chip, a central processing unit (CPU) chip, and a graphics processing unit (GPU) chip. The first electronic component 500 located on the first side of the support 1 is a hard disk, for example, an NVMe (nvm express) hard disk.

The foregoing descriptions are merely example embodiments of this disclosure, but are not intended to limit this disclosure. Any modification, equivalent replacement, or improvement made without departing from the principle of this disclosure should fall within the protection scope of this disclosure.

What is claimed is:

1. An array type connection structure comprising: a support and a plurality of connecting assemblies, wherein
the support is configured to fasten the plurality of connecting assemblies that are arranged at intervals along a length direction of the support, wherein there is no signal cable routing in the support;
each of the connecting assemblies penetrates through the support;
a first side of each of the connecting assemblies has a connector interface, the connector interface comprises a plurality of first signal terminals, and the connector interface is configured to be connected to a first electronic component located on a first side of the support;
a second side of each of the connecting assemblies is directly connected to a plurality of cables, the plurality of cables are in an one-to-one correspondence with a plurality of second signal terminals of each of the connecting assemblies, and each of the cables is configured to be connected to a second electronic component located on a second side of the support; at least a part of the second signal terminals in the plurality of second signal terminals and at least a part of the first signal terminals in the plurality of first signal terminals are electrically connected in an one-to-one correspondence inside each of the connecting assemblies; and
the support is provided with a heat dissipation through hole, and the heat dissipation through hole is at least partially located between two adjacent connecting assemblies of the plurality of connecting assemblies.

2. The array type connection structure according to claim 1, wherein the support comprises an outer plate frame and an inner slat;
the outer plate frame comprises a first side edge, a second side edge, a third side edge, and a fourth side edge that are connected, the first side edge is opposite to the third side edge, the first side edge and the third side edge extend along a length direction of the outer plate frame, the second side edge is opposite to the fourth side edge, and each of the connecting assemblies is connected to the first side edge;
the inner slat is located between the first side edge and the third side edge and is away from the first side edge, the inner slat extends along the length direction of the outer plate frame, a first end of the inner slat is connected to the second side edge, a second end of the inner slat is connected to the fourth side edge, and each of the connecting assemblies is connected to the inner slat; and
the heat dissipation through hole is located in at least one of a region between the inner slat and the first side edge or a region between the inner slat and the third side edge.

3. The array type connection structure according to claim 2, wherein the heat dissipation through hole comprises a first sub through hole and a second sub through hole;
the first sub through hole is located between one side edge of the inner slat in a length direction and the first side edge; and
the second sub through hole is located between the other side edge of the inner slat in the length direction and the third side edge.

4. The array type connection structure according to claim 2, wherein the first side edge is provided with a plurality of first mounting holes, and the first mounting holes are arranged at intervals along the length direction of the outer plate frame;
the inner slat is provided with a plurality of second mounting holes, and the second mounting holes are arranged at intervals along a length direction of the inner slat; and
each of the connecting assemblies is separately connected to a corresponding first mounting hole of the plurality of first mounting holes and a corresponding second mounting hole of the plurality of second mounting holes.

5. The array type connection structure according to claim 2, wherein the support further comprises a first reinforcing rib and a second reinforcing rib;
the first reinforcing rib is connected between one side of the inner slat in the length direction and the first side edge; and
the second reinforcing rib is connected between the other side edge of the inner slat in the length direction and the third side edge.

6. The array type connection structure according to claim 1, wherein the support comprises an outer plate frame, the outer plate frame comprises a first side edge, a second side edge, a third side edge, and a fourth side edge that are connected, the first side edge is opposite to the third side edge, the first side edge and the third side edge extend along a length direction of the outer plate frame, the second side edge is opposite to the fourth side edge, and each of the connecting assemblies is connected to the first side edge; and
the heat dissipation through hole is located among the first side edge, the second side edge, the third side edge, and the fourth side edge.

7. The array type connection structure according to claim 6, wherein the first side edge is provided with mounting holes, and the mounting holes are arranged at intervals along the length direction of the outer plate frame; and
each of the connecting assemblies is connected to a corresponding mounting hole of the mounting holes.

8. The array type connection structure according to claim 1, wherein an orthographic projection of each of the connecting assemblies on the support is at least partially located in the heat dissipation through hole; or
there is a spacing between each of the connecting assemblies and an edge of an adjacent heat dissipation through hole.

9. The array type connection structure according to claim 1, wherein at least one of the connecting assemblies comprises a housing and a connector;
the housing is located on the second side of the support and is connected to the support; and
a first part of the connector is located outside the housing and is located on the first side of the support, the plurality of first signal terminals are located in the first part of the connector, a second part of the connector is inserted into the housing, and the plurality of second signal terminals are located in the second part of the connector.

10. The array type connection structure according to claim 9, wherein the housing comprises a first sub housing and a second sub housing;
the first sub housing is connected to the support; and
the second sub housing is detachably connected to the first sub housing, and there is a gap between the second sub housing and the first sub housing for accommodating the connector.

11. The array type connection structure according to claim 10, wherein the connector comprises a first sub-connector; and the first sub-connector comprises a first lead part and a first socket part, the first lead part is located in the gap, the plurality of second signal terminals are located in the first lead part, the first socket part protrudes from the gap and is located on the first side of the support, the plurality of first signal terminals are located in the first socket part, and the first socket part is configured to be connected to the first electronic component.

12. The array type connection structure according to claim 11, wherein the first sub-connector further comprises a first fastener; and the first fastener is located between the first lead part and the first socket part, and the first fastener is separately clamped to the first sub housing and the second sub housing.

13. The array type connection structure according to claim 11, wherein the first sub-connector further comprises a positioning pin; and one end of the positioning pin is connected to the first socket part, and the other end of the positioning pin extends towards the support and is inserted into the support.

14. The array type connection structure according to claim 11, wherein the connector further comprises a second sub-connector; and the second sub-connector and the first sub-connector are spaced apart from each other, the second sub-connector comprises a second lead part and a second socket part, the second lead part is located in the gap and is electrically connected to the first lead part, the second socket part protrudes from the gap and is located on the second side of the support, and the second socket part is configured to be connected to the second electronic component.

15. The array type connection structure according to claim 14, wherein the second side of each of the connecting assemblies further comprises a plurality of third signal terminals; and the plurality of third signal terminals are located in the first lead part, at least a part of the third signal terminals in the plurality of third signal terminals and at least a part of the first signal terminals in the plurality of first signal terminals are electrically connected in an one-to-one correspondence inside each of the connecting assemblies, and the plurality of third signal terminals are connected to the second lead part.

16. The array type connection structure according to claim 14, wherein the first sub-connector is a high-speed connector, and the second sub-connector is a low-speed connector.

17. The array type connection structure according to claim 14, wherein the second sub-connector further comprises a second fastener; and the second fastener is located between the second lead part and the second socket part, and the second fastener is separately clamped to the first sub housing and the second sub housing.

18. An electronic device comprising: a frame, an array type connection structure, a fan set, a first electronic component, and a second electronic component, wherein the array type connection structure comprises a support and a plurality of connecting assemblies;
the support is configured to fasten the plurality of connecting assemblies that are arranged at intervals along a length direction of the support, wherein there is no signal cable routing in the support;
each of the connecting assemblies penetrates through the support;
a first side of each of the connecting assemblies has a connector interface, the connector interface comprises a plurality of first signal terminals, and the connector interface is configured to be connected to a first electronic component located on a first side of the support;
a second side of each of the connecting assemblies is directly connected to a plurality of cables, the plurality of cables are in an one-to-one correspondence with a plurality of second signal terminals of each of the connecting assemblies, and each of the cables is configured to be connected to a second electronic component located on a second side of the support; at least a part of the second signal terminals in the plurality of second signal terminals and at least a part of the first signal terminals in the plurality of first signal terminals are electrically connected in an one-to-one correspondence inside each of the connecting assemblies;
the support is provided with a heat dissipation through hole, and the heat dissipation through hole is at least partially located between two adjacent connecting assemblies;
a support of the array type connection structure is connected to the frame;
the fan set is connected to the frame, the fan set is disposed opposite to the array type connection structure, and the fan set is located on a second side of the support;
a plurality of first electronic components are located on a first side of the support and are electrically connected to connector interfaces of connecting assemblies; and
a plurality of second electronic components are located on the second side of the support and are electrically connected to cables.

19. The electronic device according to claim 18, wherein the support comprises an outer plate frame and an inner slat;

the outer plate frame comprises a first side edge, a second side edge, a third side edge, and a fourth side edge that are connected, the first side edge is opposite to the third side edge, the first side edge and the third side edge extend along a length direction of the outer plate frame, the second side edge is opposite to the fourth side edge, and each of the connecting assemblies is connected to the first side edge;
the inner slat is located between the first side edge and the third side edge and is away from the first side edge, the inner slat extends along the length direction of the outer plate frame, a first end of the inner slat is connected to the second side edge, a second end of the inner slat is connected to the fourth side edge, and each of the connecting assemblies is connected to the inner slat; and
the heat dissipation through hole is located in at least one of a region between the inner slat and the first side edge or a region between the inner slat and the third side edge.

20. The electronic device according to claim 19, wherein the heat dissipation through hole comprises a first sub through hole and a second sub through hole;

the first sub through hole is located between one side edge of the inner slat in a length direction and the first side edge; and the second sub through hole is located between the other side edge of the inner slat in the length direction and the third side edge.

* * * * *